(12) United States Patent
Chan et al.

(10) Patent No.: US 8,389,851 B2
(45) Date of Patent: Mar. 5, 2013

(54) METAL TRACE FABRICATION FOR OPTICAL ELEMENT

(75) Inventors: Hing Wah Chan, San Jose, CA (US); Harold Ackler, Boise, ID (US); Scott E. Solberg, Mountain View, CA (US); John S. Fitch, Los Altos, CA (US); David K. Fork, Mountain View, CA (US); David G. Duff, Portola Valley, CA (US); Michael C. Weisberg, Woodside, CA (US)

(73) Assignees: Palo Alto Research Center Incorporated, Palo Alto, CA (US); SolFocus, Inc., Mountain View, CA (US)

( * ) Notice: Subject to any disclaimer, the term of this patent is extended or adjusted under 35 U.S.C. 154(b) by 226 days.

(21) Appl. No.: 12/909,488

(22) Filed: Oct. 21, 2010

(65) Prior Publication Data

US 2011/0031211 A1    Feb. 10, 2011

Related U.S. Application Data

(62) Division of application No. 11/782,609, filed on Jul. 24, 2007, now abandoned.

(51) Int. Cl.
*H01L 31/042* (2006.01)
(52) U.S. Cl. ................................. 136/246; 126/686
(58) Field of Classification Search ............... 136/246, 136/259
See application file for complete search history.

(56) References Cited

U.S. PATENT DOCUMENTS

| | | | |
|---|---|---|---|
| 3,923,381 A | 12/1975 | Winston | |
| 3,988,166 A | 10/1976 | Beam | |
| 4,021,267 A | 5/1977 | Dettling | |
| 4,045,246 A | 8/1977 | Mlavsky et al. | |
| 4,053,327 A | 10/1977 | Meulenberg, Jr. | |
| 4,084,985 A | 4/1978 | Evans, Jr. | |
| 4,086,485 A | 4/1978 | Kaplow et al. | |
| 4,095,997 A | 6/1978 | Griffiths | |
| 4,114,596 A | 9/1978 | Chang et al. | |
| 4,131,485 A | 12/1978 | Meinel et al. | |
| 4,148,301 A | 4/1979 | Cluff | |
| 4,177,083 A | 12/1979 | Kennedy | |
| 4,221,468 A | 9/1980 | Macken | |
| 4,224,081 A | 9/1980 | Kawamura et al. | |
| 4,234,351 A | 11/1980 | Deminet et al. | |

(Continued)

FOREIGN PATENT DOCUMENTS

| CN | 2606309 Y | 3/2004 |
|---|---|---|
| CN | 1854637 A | 11/2006 |

(Continued)

OTHER PUBLICATIONS

Mulligan et al. "A Flat-Plate Concentrator: Micro-Concentrator Design Overview", 2000 IEEE, pp. 1495-1497.

(Continued)

*Primary Examiner* — Miriam Berdichevsky
(74) *Attorney, Agent, or Firm* — Bever, Hoffman & Harms, LLP; Patrick T. Bever (57) ABSTRACT

A system may include an optical element including a surface defining a recess, conductive material disposed within the recess, and a solder mask disposed over a portion of the conductive material. The solder mask may define an aperture through which light from the optical element may pass. Some aspects provide creation of an optical element including a surface defining a recess, deposition of conductive material on the surface such that a portion of the deposited conductive material is disposed within the recess, and substantial planarization of the surface to expose the portion of the conductive material disposed within the recess.

14 Claims, 12 Drawing Sheets

U.S. PATENT DOCUMENTS

| | | | |
|---|---|---|---|
| 4,296,731 A | 10/1981 | Cluff | |
| 4,320,251 A | 3/1982 | Narasimhan et al. | |
| 4,331,703 A | 5/1982 | Lindmayer | |
| 4,337,758 A | 7/1982 | Meinel et al. | |
| 4,440,153 A | 4/1984 | Melchior | |
| 4,683,348 A | 7/1987 | Pidgeon et al. | |
| 4,711,972 A | 12/1987 | O'Neill | |
| 4,746,370 A | 5/1988 | Woolf | |
| 4,771,764 A | 9/1988 | Cluff | |
| 4,792,685 A | 12/1988 | Yamakawa | |
| 4,841,946 A | 6/1989 | Marks | |
| 4,847,349 A | 7/1989 | Ohta et al. | |
| 4,849,028 A | 7/1989 | Krause | |
| 4,855,884 A | 8/1989 | Richardson | |
| 4,947,825 A | 8/1990 | Moriarty | |
| 4,952,026 A | 8/1990 | Bellman et al. | |
| 5,004,319 A | 4/1991 | Smither | |
| 5,062,899 A | 11/1991 | Kruer | |
| 5,089,055 A | 2/1992 | Nakamura | |
| 5,167,724 A | 12/1992 | Chiang | |
| 5,172,170 A | 12/1992 | Hays et al. | |
| 5,180,441 A | 1/1993 | Cornwall et al. | |
| 5,216,543 A | 6/1993 | Calhoun | |
| 5,344,496 A | 9/1994 | Stern et al. | |
| 5,389,159 A | 2/1995 | Kataoka et al. | |
| 5,404,869 A | 4/1995 | Parkyn, Jr. et al. | |
| 5,501,743 A | 3/1996 | Cherney | |
| 5,529,054 A | 6/1996 | Shoen | |
| 5,540,216 A | 7/1996 | Rasmusson | |
| 5,552,820 A | 9/1996 | Genovese | |
| 5,559,677 A | 9/1996 | Errichiello | |
| 6,011,307 A | 1/2000 | Jiang et al. | |
| 6,020,554 A | 2/2000 | Kaminar et al. | |
| 6,091,017 A | 7/2000 | Stern | |
| 6,094,273 A | 7/2000 | Asher et al. | |
| 6,097,530 A | 8/2000 | Asher et al. | |
| 6,118,067 A | 9/2000 | Lashley et al. | |
| 6,130,465 A | 10/2000 | Cole | |
| 6,131,565 A | 10/2000 | Mills | |
| 6,140,570 A | 10/2000 | Kariya | |
| 6,165,389 A | 12/2000 | Asher et al. | |
| 6,239,353 B1 | 5/2001 | Hall et al. | |
| 6,274,508 B1 | 8/2001 | Jacobsen et al. | |
| 6,278,054 B1 | 8/2001 | Ho et al. | |
| 6,379,521 B1 | 4/2002 | Nishio | |
| 6,407,329 B1 | 6/2002 | Iino et al. | |
| 6,410,644 B2 | 6/2002 | Mumick et al. | |
| 6,420,266 B1 | 7/2002 | Smith et al. | |
| 6,451,429 B2 | 9/2002 | Mumick et al. | |
| 6,479,395 B1 | 11/2002 | Smith et al. | |
| 6,527,964 B1 | 3/2003 | Smith et al. | |
| 6,531,653 B1 | 3/2003 | Glenn et al. | |
| 6,568,863 B2 | 5/2003 | Murata | |
| 6,590,235 B2 | 7/2003 | Carey et al. | |
| 6,597,510 B2 | 7/2003 | Bunkenburg et al. | |
| 6,623,579 B1 | 9/2003 | Smith et al. | |
| 6,896,381 B2 | 5/2005 | Benitez et al. | |
| 6,958,868 B1 | 10/2005 | Pender | |
| 7,045,794 B1 | 5/2006 | Spallas et al. | |
| 7,152,985 B2 | 12/2006 | Benitez et al. | |
| 7,160,522 B2 | 1/2007 | Minano Dominguez et al. | |
| 7,181,378 B2 | 2/2007 | Benitez et al. | |
| 7,638,708 B2 | 12/2009 | Fork et al. | |
| 2002/0056473 A1 | 5/2002 | Chandra et al. | |
| 2002/0148497 A1 | 10/2002 | Sasaoka et al. | |
| 2002/0149107 A1 | 10/2002 | Chang et al. | |
| 2003/0051750 A1 | 3/2003 | Lawheed | |
| 2003/0232174 A1 | 12/2003 | Chang et al. | |
| 2004/0031517 A1 | 2/2004 | Bareis | |
| 2004/0070855 A1 | 4/2004 | Benitez et al. | |
| 2004/0084077 A1 | 5/2004 | Aylaian | |
| 2004/0151014 A1 | 8/2004 | Speakman | |
| 2004/0191422 A1 | 9/2004 | Kataoka et al. | |
| 2004/0211460 A1 | 10/2004 | Simburger et al. | |
| 2005/0029236 A1 | 2/2005 | Gambino et al. | |
| 2005/0034751 A1 | 2/2005 | Gross et al. | |
| 2005/0046977 A1 | 3/2005 | Shifman | |
| 2005/0081908 A1 | 4/2005 | Stewart | |
| 2006/0207650 A1* | 9/2006 | Winston et al. | 136/259 |
| 2006/0231133 A1* | 10/2006 | Fork et al. | 136/246 |
| 2007/0137690 A1 | 6/2007 | Bruning et al. | |
| 2007/0137691 A1 | 6/2007 | Cobb et al. | |
| 2008/0047605 A1 | 2/2008 | Benitez et al. | |
| 2008/0186593 A1 | 8/2008 | Chan et al. | |
| 2008/0308154 A1 | 12/2008 | Cart et al. | |
| 2009/0056789 A1 | 3/2009 | Draganov | |
| 2009/0084374 A1 | 4/2009 | Mills et al. | |

FOREIGN PATENT DOCUMENTS

| | | |
|---|---|---|
| DE | 3104690 A1 | 8/1982 |
| DE | 3205439 A1 | 8/1983 |
| DE | 3633172 A1 | 4/1988 |
| DE | 19735281 A1 | 2/1999 |
| EP | 0200496 A2 | 11/1986 |
| EP | 0575797 A1 | 12/1993 |
| EP | 1715260 A | 10/2006 |
| JP | 2-122159 A | 5/1990 |
| KR | 20010104037 A | 11/2001 |
| WO | 94/28361 A1 | 12/1994 |
| WO | 00/49421 A1 | 8/2000 |
| WO | 00/49658 A1 | 8/2000 |
| WO | 02/097724 A1 | 12/2002 |
| WO | 2007/104028 A1 | 9/2007 |
| WO | WO2007/104028 A1 | 9/2007 |
| WO | WO2007109901 A1 | 10/2007 |

OTHER PUBLICATIONS

Terao et al. "A Mirror-Less Design for Micro-Concentrator Modules", Conference Record of the 28th IEEE Photovoltaic Specialists Conference (2000) pp. 1416-1419.

Mulligan et al. "Development of Chip-Size Silicon Solar Cells", IEEE Photovoltaic Specialists Conference, 2000, pp. 158-163.

Bett et al. "FLATCON and FLASHCON Concepts for High Concentration PV", Presented at the 19th European Photovoltaic Solar Energy Conf., Jun. 7-11, 2004, Paris, 4 pages.

Benitez et al. "High-Concentration Mirror-Based Kohler Integrating System for Tandem Solar Cells", WCPEC2006, 4 pages.

Terao, Akira "MicroDish: A Novel Reflective Optic for Flat-Plate Micro-Concentrator", SPIE's 49th Annual Meeting, Aug. 2-6, 2004, Denver, Colorado, USA, 9 pages.

Sun et al. "Modeling and Experimental Evaluation of Passive Heat Sinks for Miniature High-Flux Photovoltaic Concentrators", Transactions of the ASME, vol. 127, pp. 138-145 (2005).

Gordon et al. "Optical performance at the thermodynamic limit with tailored imaging designs", Applied Optics, in press, Dec. 2004, 16 pages.

Alvarez et al. "RXI Concentrator for 1000X Photovoltaic Energy Conversion", Proc. SPIE, vol. 3781, 30 (1999), 9 pages.

Swanson, Richard M. "The Promise of Concentrators", Prog. Photovolt. Res. Appl. 8, pp. 93-111 (2000).

Nguyen, Luu "Wafer Level Packaging for Analog/Mixed Signal Applications", MEPTEC Int. Wafer Level Packaging Conference, Aug. 22, 2002, 41 pages.

* cited by examiner

METAL TRACE FABRICATION FOR OPTICAL ELEMENT

CROSS-REFERENCE TO RELATED APPLICATIONS

The present application is a divisional of U.S. patent application Ser. No. 11/782,609, filed on Jul. 24, 2007 and entitled "Metal Trace Fabrication For Optical Element" which claims priority to U.S. Provisional Patent Application Ser. No. 60/899,150, filed on Feb. 2, 2007 and entitled "Concentrated Photovoltaic Energy Designs", the contents of which are incorporated herein by reference for all purposes.

BACKGROUND

1. Field

Some embodiments generally relate to electrical systems incorporating one or more optical elements. More specifically, embodiments may relate to an optical element efficiently adapted for interconnection to electrical devices.

2. Brief Description

In some conventional devices, an optical element (e.g., a lens) may include metal traces for interconnection to an electrical circuit. The metal traces may be fabricated on and/or within the optical element using any of several known techniques. For example, the metal traces may be deposited using thin or thick film lithography. Lithography, however, requires expensive equipment and time-consuming processes.

Since a typical optical element does not include distinguishing surface features, lithographic techniques also require fiducial marks for proper alignment of the metal traces on the optical element. However, the placement of the fiducial marks on the optical element is also difficult due to the lack of surface features and the material of which the optical element is composed (e.g., glass).

What is needed is a system to efficiently incorporate metal traces into an optical element.

SUMMARY

To address at least the foregoing, some aspects provide a method, means and/or process steps to create an optical element including a surface defining a recess, deposit conductive material on the surface such that a portion of the deposited conductive material is disposed within the recess, and substantially planarize the surface to expose the portion of the conductive material disposed within the recess.

Creation of the optical element may include molding the optical element with a mold defining the optical element and the recess. Also or alternatively, deposition of the conductive material may include placing a stencil on the optical element prior to metal spraying the conductive material onto the optical element.

In some aspects, a reflective material is deposited on the optical element and not on the surface, an electrical isolator is deposited on the reflective material but not on the surface, and the conductive material is deposited on the electrical isolator. Aspects may include deposition of a solder mask over the exposed portion of the conductive material, wherein the solder mask defines an aperture through which light from the optical element may pass. Further to the foregoing aspects, a terminal of a solar cell may be coupled to the exposed portion of the conductive material such that a portion of the solar cell is disposed over the aperture.

In other aspects, provided are an optical element including a surface defining a recess, conductive material disposed within the recess, and a solder mask disposed over a portion of the conductive material. The solder mask may define an aperture through which light from the optical element may pass. The optical element may comprise a transparent portion including the surface, and light may pass from the transparent portion through the aperture.

According to further aspects, a reflective material may be disposed on the optical element and not on the surface, an electrical isolator may be disposed on the reflective material and not on the surface, and second conductive material may be disposed on the electrical isolator. Some aspects include a solar cell having a terminal coupled to a portion of the conductive material exposed by the aperture, wherein a portion of the solar cell is disposed to receive the light from the aperture.

The claims are not limited to the disclosed embodiments, however, as those in the art can readily adapt the description herein to create other embodiments and applications.

BRIEF DESCRIPTION OF THE DRAWINGS

The construction and usage of embodiments will become readily apparent from consideration of the following specification as illustrated in the accompanying drawings, in which like reference numerals designate like parts.

DETAILED DESCRIPTION

The following description is provided to enable any person in the art to make and use the described embodiments and sets forth the best mode contemplated for carrying out some embodiments. Various modifications, however, will remain readily apparent to those in the art.

Figure 1:
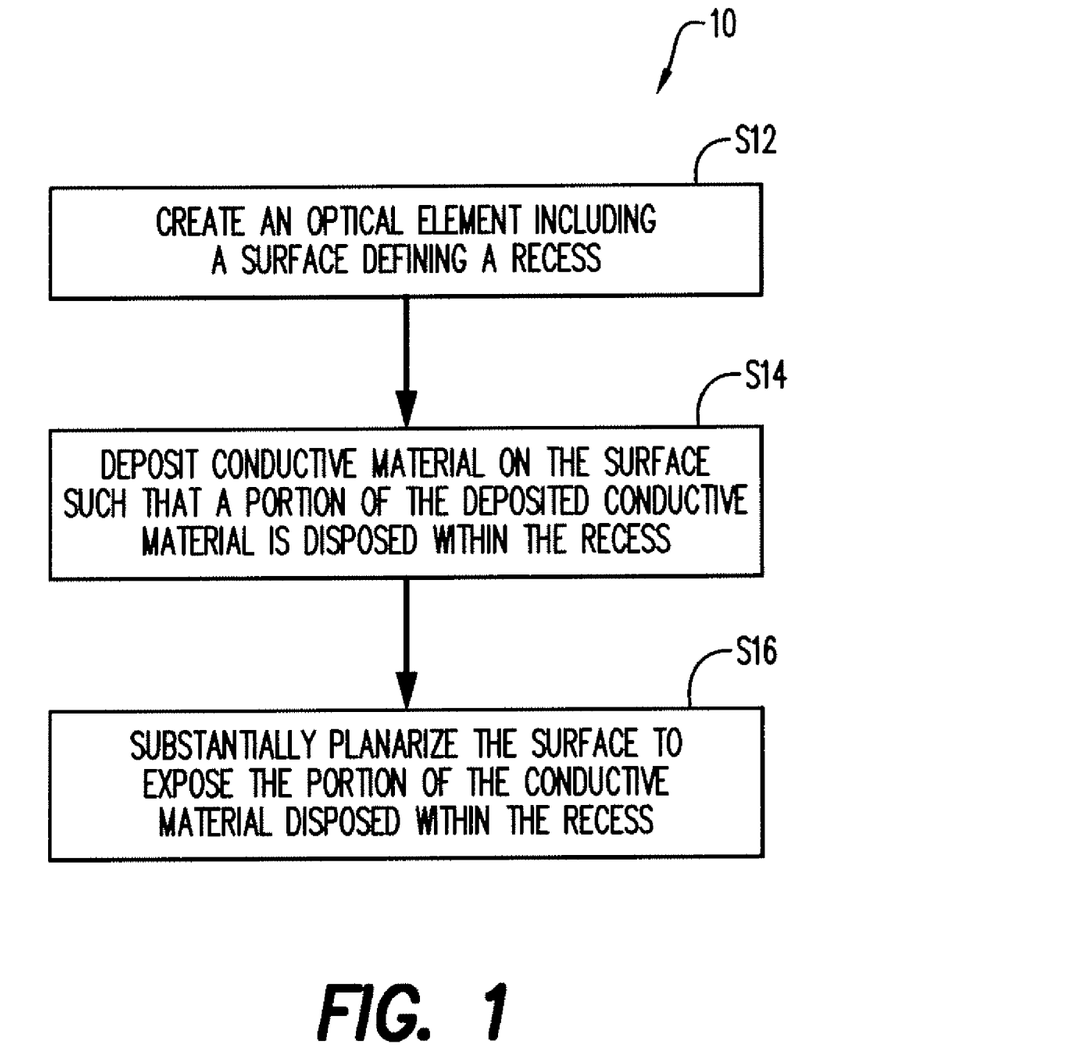
FIG. 1 is a flow diagram of a method according to some embodiments.

FIG. 1 is a flow diagram of process 10 according to some embodiments. Process 10 may be performed by any combination of machine, hardware, software and manual means.

Initially, an optical element is created at S12. The optical element includes a surface defining a recess, and may be composed of any suitable material or combination of materials. According to some embodiments, the optical element may be configured to manipulate and/or pass desired wavelengths of light. The optical element may comprise any number of disparate materials and/or elements (e.g., lenses, mirrors, etc.) according to some embodiments.

The optical element may be created using any combination of devices and systems that is or becomes known. Some embodiments of S12 include depositing a liquid or powder into a mold and cooling, heating and/or pressuring the mold. The mold may define the optical element as well as the aforementioned recesses. Alternatively, the recesses may be formed (e.g., by etching, milling, etc.) after the optical element is molded.

Figure 2:
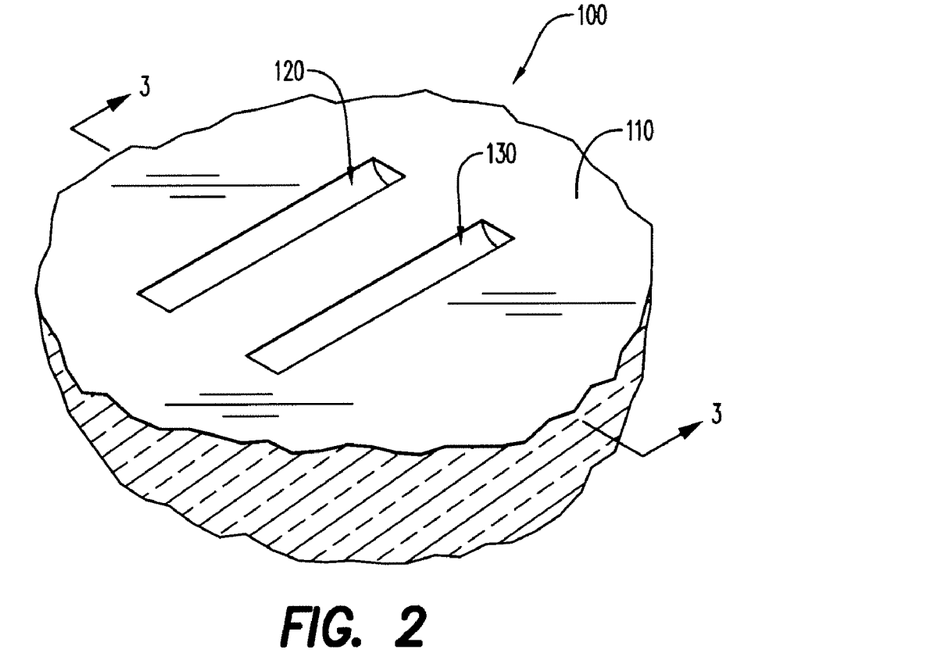
FIG. 2 is a perspective view of a portion of an optical element according to some embodiments.
Figure 3:
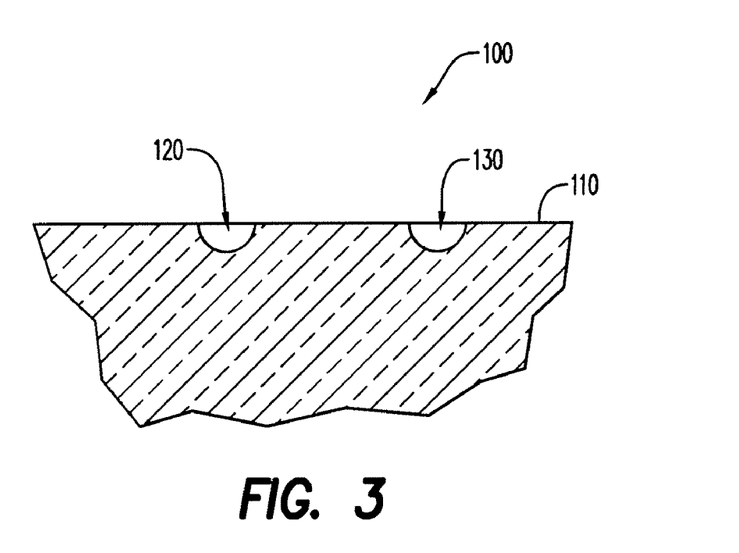
FIG. 3 is a cross-sectional view of a portion of an optical element according to some embodiments.

FIG. 2 is a perspective view of a portion of optical element 100 according to some embodiments, and FIG. 3 is a cross-sectional view of optical element 100. FIGS. 2 and 3 show only a portion of optical element 100 in order to illustrate that optical element 100 may exhibit any suitable shape or size. Element 100 may be fabricated according to S12 of FIG. 1, but S12 is not limited thereto.

The illustrated portion of optical element 100 comprises surface 110, recess 120 and recess 130. In the present description, surface 110 includes portions of element 100 which define recess 120 and recess 130. As mentioned above, recess 120 and recess 130 may have been defined by a mold used to create optical element 100 or foamed after creation of optical element 100.

Returning to process 10, conductive material is deposited on the surface of the optical element at S14. The material is deposited such that a portion of the deposited material is disposed within the defined recess. The conductive material may be composed of any combination of one or more materials. In some embodiments, the conductive material comprises nickel. Moreover, the conductive material may be deposited using any suitable process that is or becomes known, including but not limited to sputtering, chemical vapor deposition, sol gel techniques and thermal spraying (e.g., twin wire arcing, plasma spraying).

Figure 4:
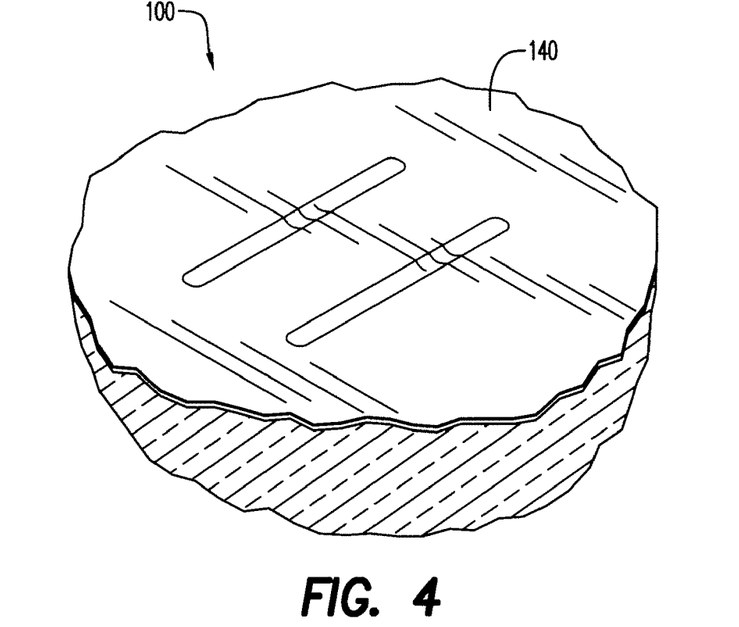
FIG. 4 is a perspective view of a portion of an optical element with conductive material disposed thereon according to some embodiments.
Figure 5:
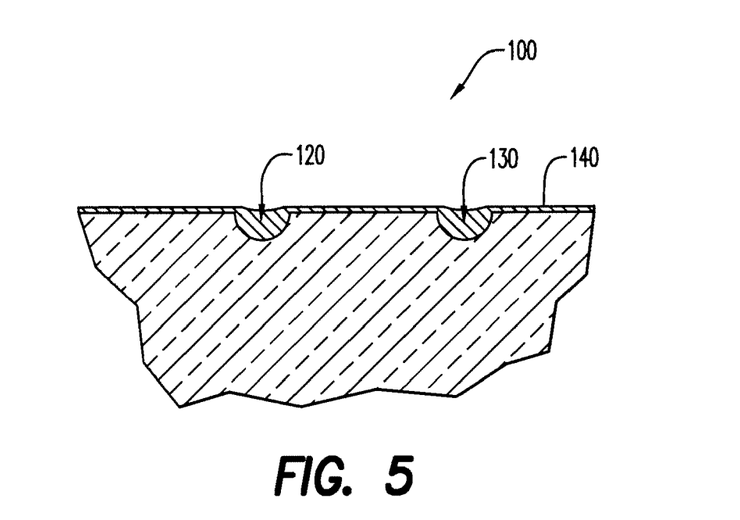
FIG. 5 is a cross-sectional view of a portion of an optical element with conductive material disposed thereon according to some embodiments.

FIG. 4 is a perspective view of optical element 100 after S14 according to some embodiments. FIG. 5 is a cross-sectional view of optical element 100 as shown in FIG. 4. Conductive material 140 is depicted covering surface 110 of element 100.

Conductive material 140 is disposed within the recesses defined by surface 110. A thickness of material 140 within recesses 120 and 130 is greater than a thickness of material 140 on other portions of surface 110, but embodiments are not limited thereto. Moreover, a thickness of material 140 on the other portions of surface 110 need not be as uniform as shown in FIG. 5. Generally, a height of conductive material 140 on various portions of surface 110 may depend on the technique used to deposit material 140 at S14.

The surface of the optical element is substantially planarized at S16. The planarization exposes the portion of the conductive material disposed within the recess. Chemical-mechanical polishing may be employed at S16 to substantially planarize the surface, but embodiments are not limited thereto. Planarization may comprise removing an uppermost portion of the surface of the optical element as well as an upper layer of the conductive material.

Figure 6:
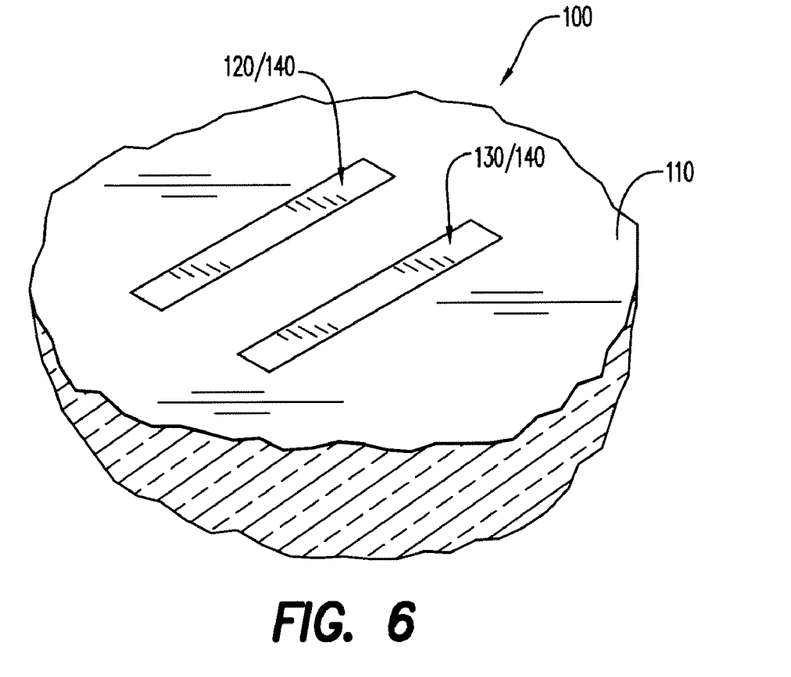
FIG. 6 is a perspective view of a substantially planarized portion of an optical element according to some embodiments.
Figure 7:
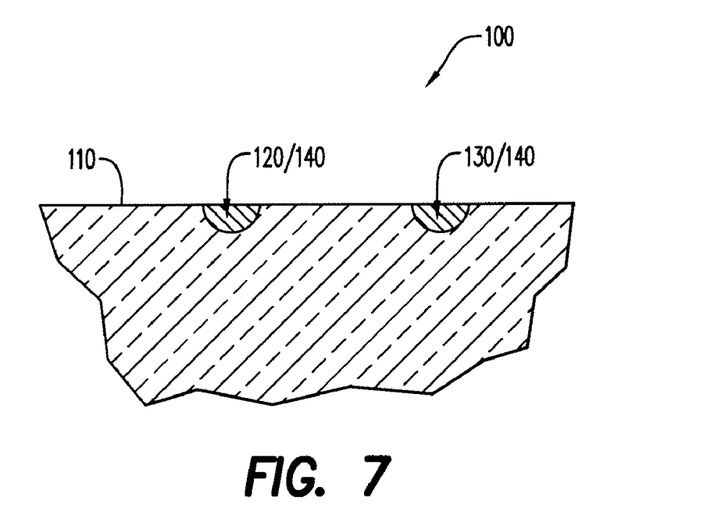
FIG. 7 is a cross-sectional view of a substantially planarized portion of an optical element according to some embodiments.

FIGS. 6 and 7 depict element 100 after some embodiments of S16. As shown, conductive material 140 is disposed within recess 120 and recess 130 and is substantially flush with adjacent portions of surface 110. According to some embodiments, conductive material 140 may be electrically coupled to an electrical device and/or to other conductive traces.

Figure 8:
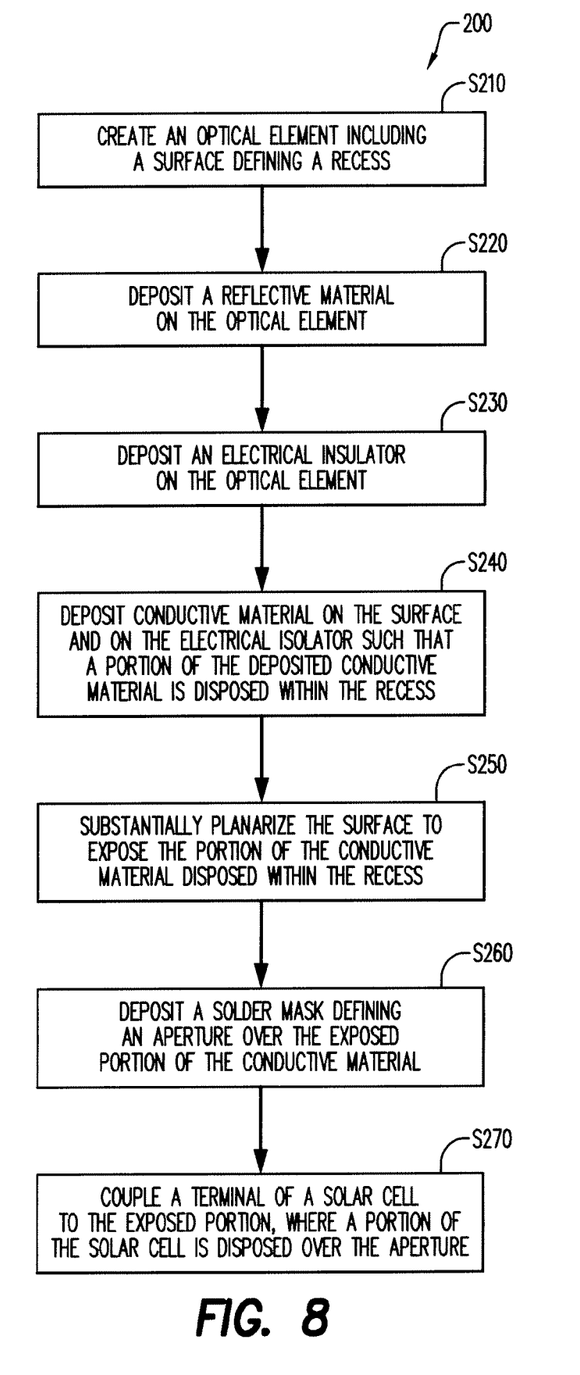
FIG. 8 is a flow diagram of a method according to some embodiments.

FIG. 8 is a flow diagram of process 200 according to some embodiments. Process 200 may be performed by any combination of machine, hardware, software and manual means.

Process 200 begins at S210, at which an optical element is created. As described with respect to S12, the optical element includes a surface defining a recess, and may be composed of any suitable material or combination of materials. The optical element may be created using any combination of devices and systems that is or becomes known.

Figure 9A:
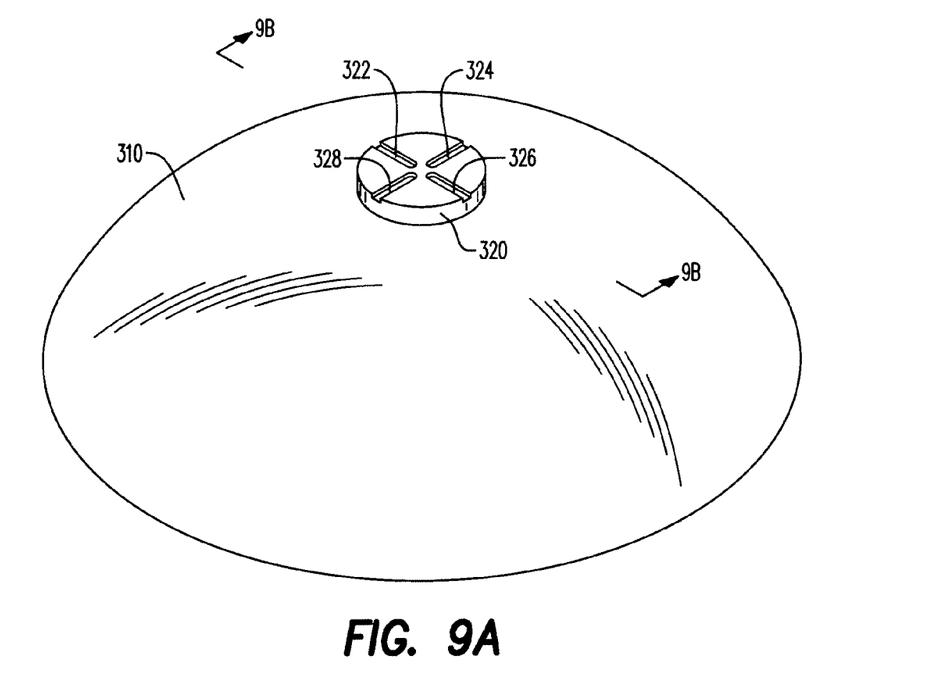
FIG. 9A is a perspective view of a transparent optical element according to some embodiments.
Figure 9B:
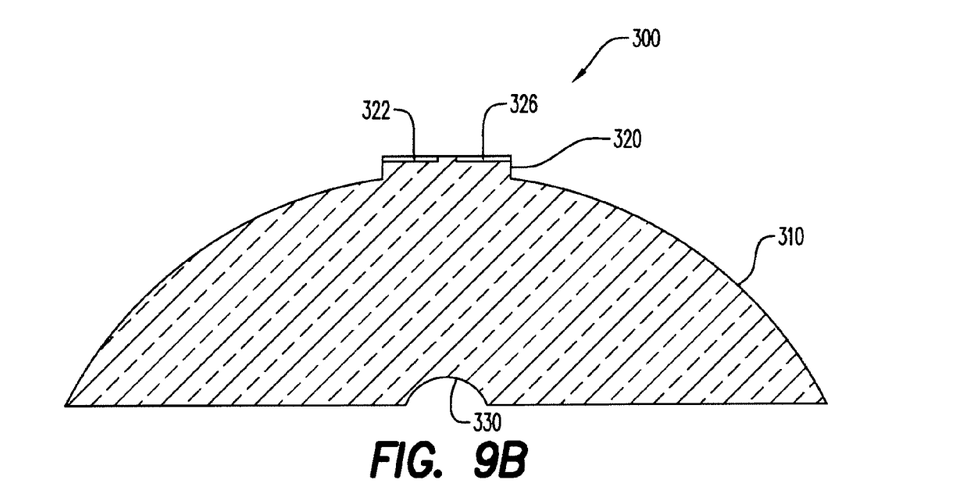
FIG. 9B is a cross-sectional view of a transparent optical element according to some embodiments.

FIG. 9A is a perspective view of optical element 300 created at S210 according to some embodiments, and FIG. 9B is a cross-sectional view of element 300. Optical element 300 may be molded from low-iron glass at S210 using known methods. Alternatively, separate pieces may be glued or otherwise coupled together to form element 300. Optical element 300 may comprise an element of a solar concentrator according to some embodiments.

Element 300 includes convex surface 310, pedestal 320 defining recesses 322, 324, 326 and 328, and concave surface 330. Recesses 322, 324, 326 and 328 may have been defined by a mold used to create optical element 300 or formed after creation of optical element 300. The purposes of each portion of element 300 during operation according to some embodiments will become evident from the description below.

A reflective material is deposited on the optical element at S220. The reflective material may be intended to create one or more mirrored surfaces. Any suitable reflective material may be used, taking into account factors such as but not limited to the wavelengths of light to be reflected, bonding of the reflective material to the optical element, and cost. The reflective material may be deposited by sputtering or liquid deposition.

Figure 10A:
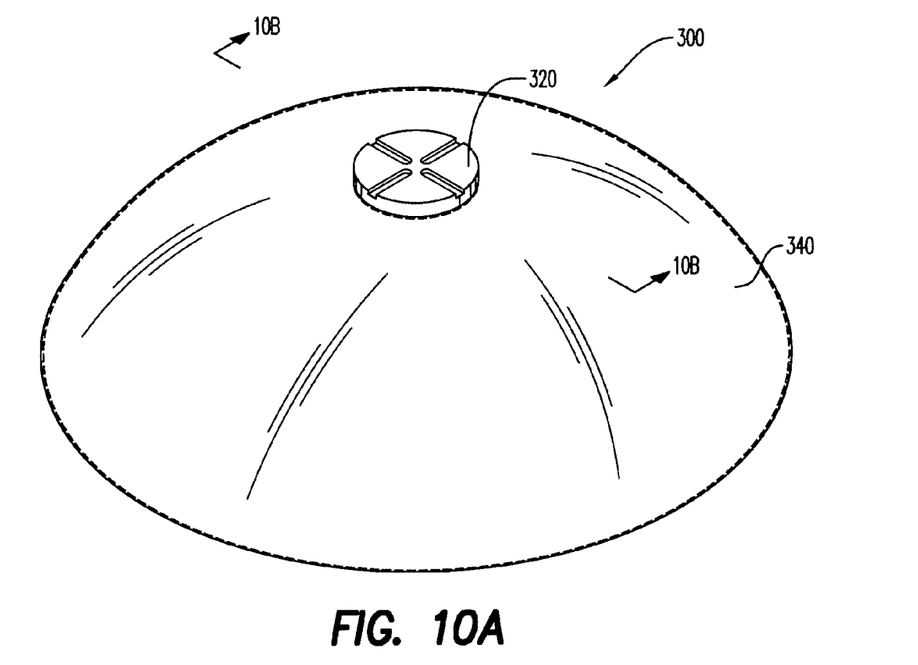
FIG. 10A is a perspective view of a transparent optical element with reflective material disposed thereon according to some embodiments.
Figure 10B:
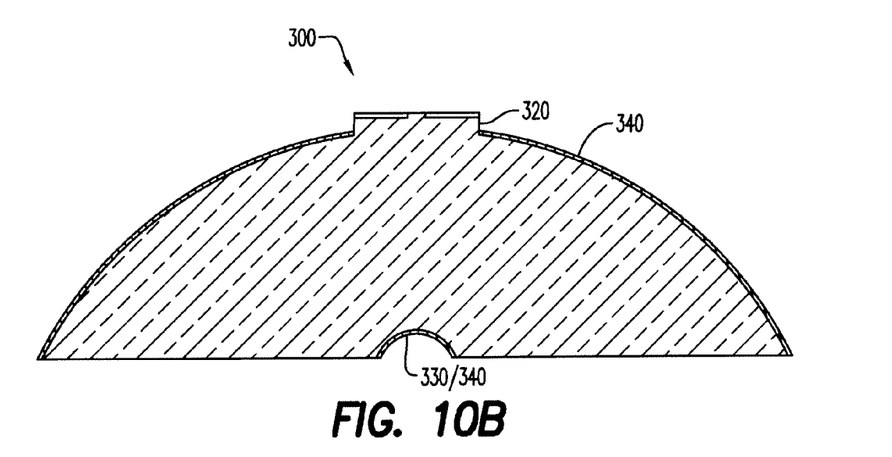
FIG. 10B is a cross-sectional view of a transparent optical element with reflective material disposed thereon according to some embodiments.

FIGS. 10A and 10B show perspective and cross-sectional views, respectively, of optical element 300 after some embodiments of S220. Reflective material 340 is deposited on convex surface 310 and concave surface 330. Reflective material 340 may comprise sputtered silver or aluminum. The vertical and horizontal surfaces of pedestal 320 may be masked at S220 such that reflective material 340 is not deposited thereon, or otherwise treated to remove any reflective material 340 that is deposited thereon.

Next, at S230, an electrical insulator is deposited on the optical element. The insulator may comprise any suitable insulator or insulators. Non-exhaustive examples include polymers, dielectrics, polyester, epoxy and polyurethane. The insulator may be deposited using any process that is or becomes known. In some embodiments, the insulator is powder-coated onto the optical element.

Figure 11A:
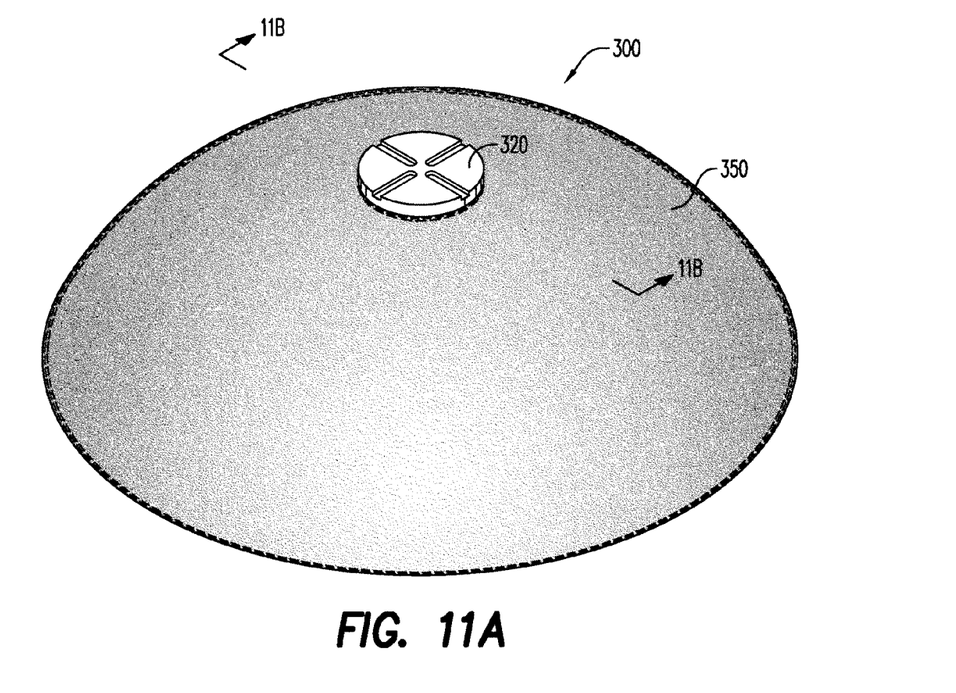
FIG. 11A is a perspective view of an optical element with an electrical isolator disposed thereon according to some embodiments.
Figure 11B:
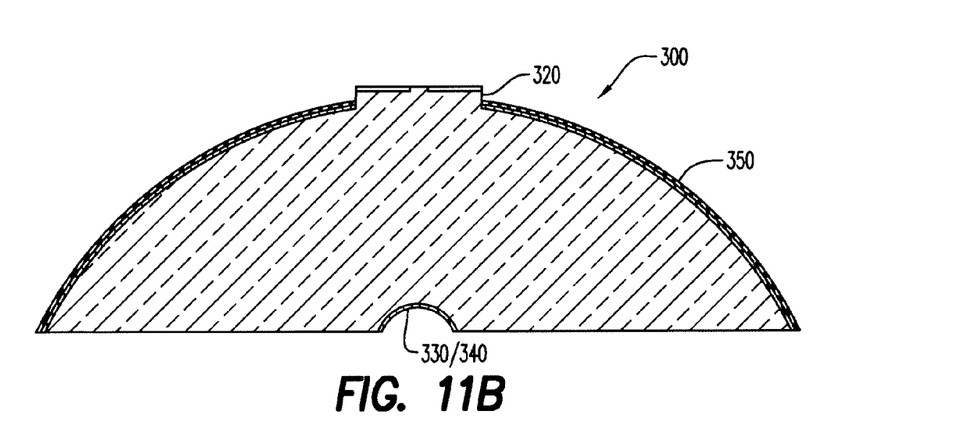
FIG. 11B is a cross-sectional view of an optical element with an electrical isolator disposed thereon according to some embodiments.

Some embodiments of S230 are depicted in FIGS. 11A and 11B. Insulator 350 is deposited on convex surface 310 or, more particularly, on reflective material 340. Again, S230 is executed such that insulator 350 is not deposited on the vertical and horizontal surfaces of pedestal 320. According to the illustrated embodiment, insulator 340 is not deposited on concave surface 330 (i.e., on reflective material 340 deposited on concave surface 330).

Returning to process 200, a pattern of conductive material is deposited on the surface and the electrical isolator at S240 such that a portion of the deposited conductive material is disposed within the defined recess. The conductive material may be composed of any combination of one or more materials (e.g., nickel, copper). Sputtering, chemical vapor deposition, thermal spraying, lithography, and or other techniques may be used at S240 to deposit the conductive material on the surface and on the electrical isolator.

Figure 12A:
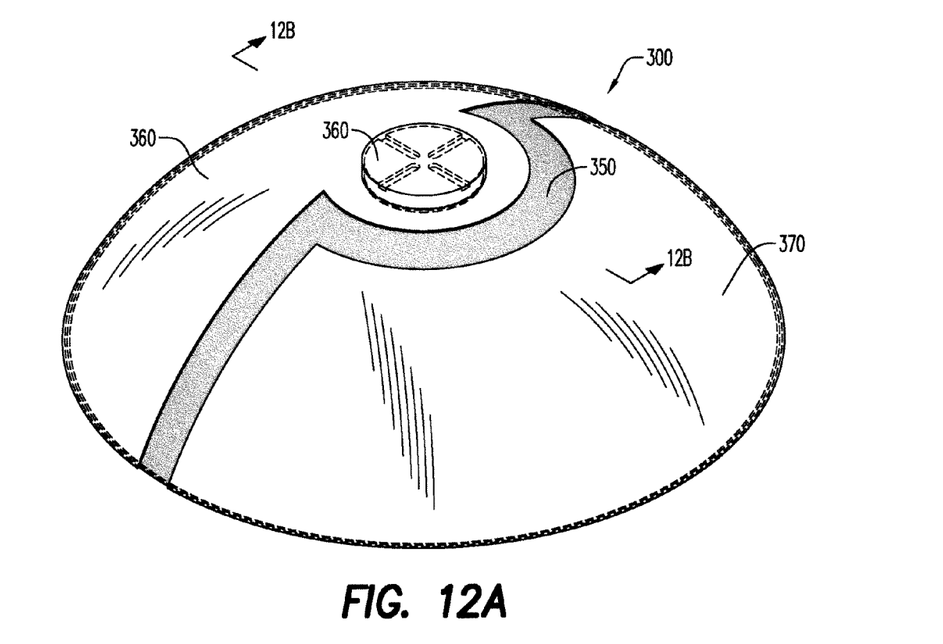
FIG. 12A is a perspective view of an optical element with conductive material disposed thereon according to some embodiments.
Figure 12B:
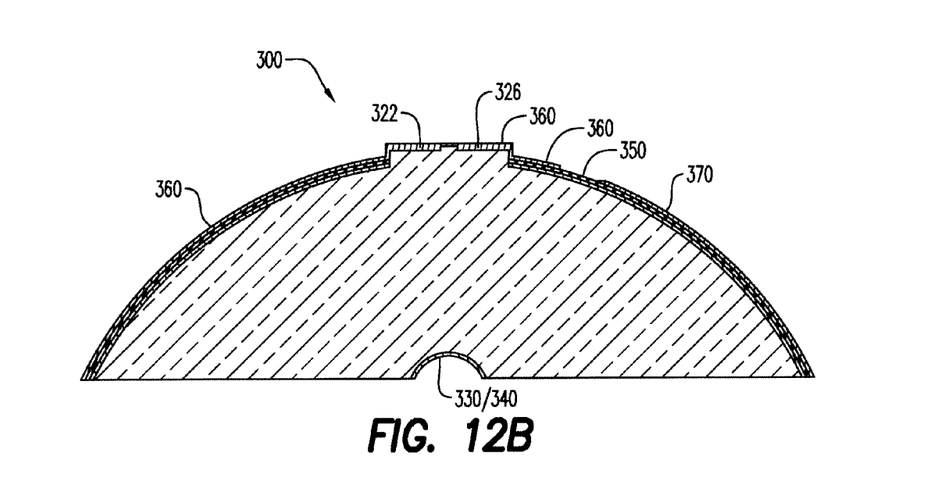
FIG. 12B is a cross-sectional view of an optical element with conductive material disposed thereon according to some embodiments.

FIG. 12A is a perspective view and FIG. 12B is a cross-sectional view of optical element 300 after S240 according to some embodiments. Conductive material 360 covers pedestal 320 and portions of insulator 350. FIG. 12B shows conductive material 360 disposed within recesses 322 and 326. Conductive material 360 disposed in recesses 322 and 326 is contiguous with, and therefore electrically connected to, conductive material 360 disposed on insulator 350. Although conductive material 360 appears to extend to a uniform height above element 300, this height need not be uniform.

Conductive material 370, which may be different from or identical to material 360, also covers portions of insulator 350. Conductive material 360 and conductive material 370 define a gap to facilitate electrical isolation from one another. Embodiments such as that depicted in FIGS. 12A and 12B may include placing a stencil in the shape of the illustrated gap on electrical isolator 350 and depositing conductive material 360 and 370 where shown and on the stencil. Removal of the stencil may then result in the apparatus of FIGS. 12A and 12B.

Conductive materials 360 and 370 may create a conductive path for electrical current generated by a photovoltaic (solar) cell coupled to element 300. Conductive material 360 and conductive material 370 may also, as described in U.S. Patent Application Publication No. 2006/0231133, electrically link solar cells of adjacent solar concentrators in a solar concentrator array.

At S250, the surface of the optical element is substantially planarized to expose the portion of the conductive material disposed within the recess. Planarization may comprise chemical-mechanical polishing or any other suitable system. As described above, planarization may also comprise removing an uppermost portion of the surface of the optical element as well as an upper layer of the conductive material.

Figure 13A:
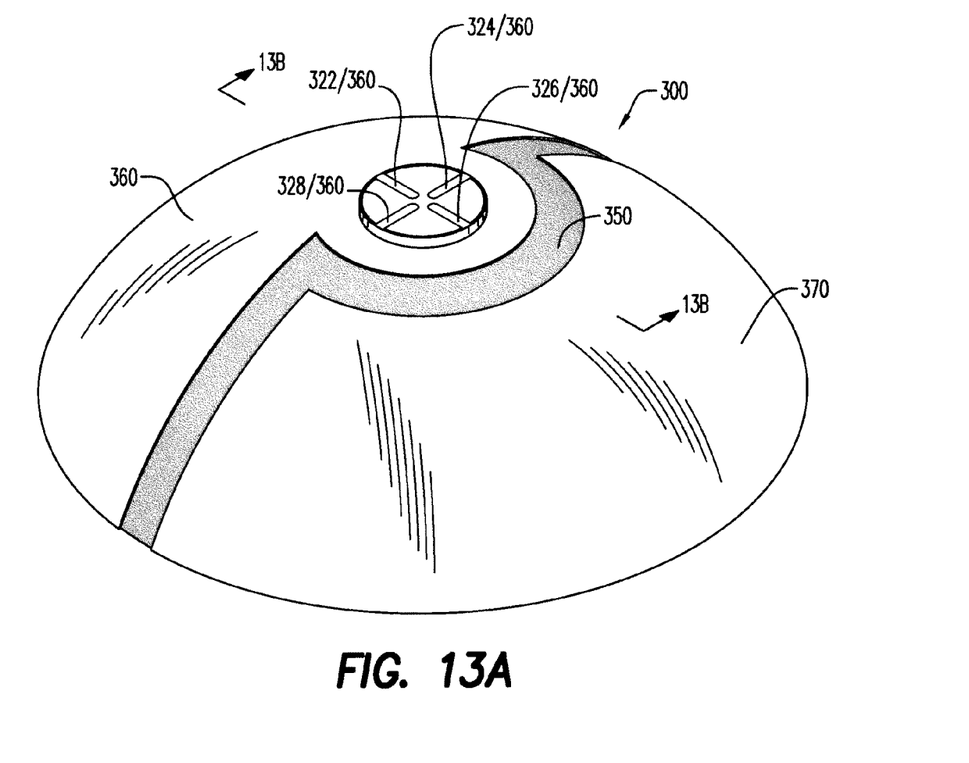
FIG. 13A is a perspective view of an optical element after planarization of a portion thereof according to some embodiments.
Figure 13B:
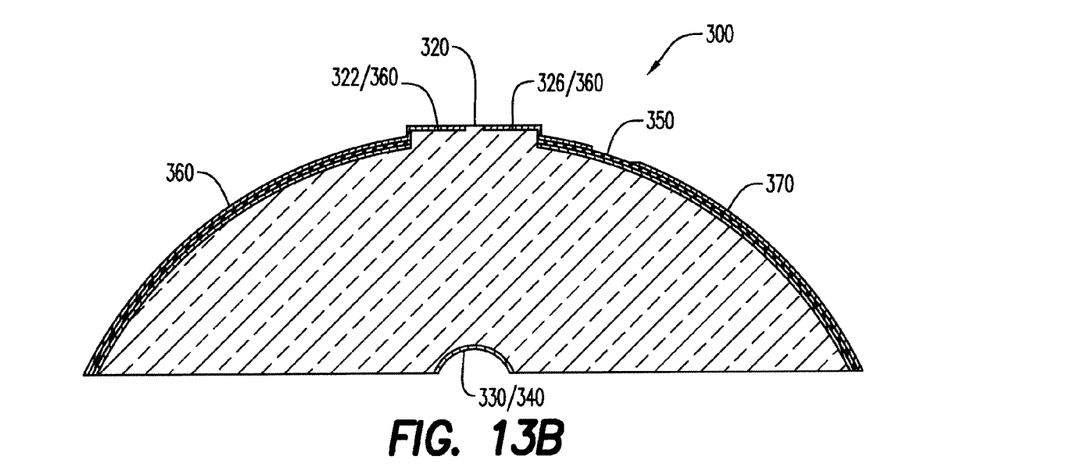
FIG. 13B is a cross-sectional view of an optical element after planarization of a portion thereof according to some embodiments.

FIGS. 13A and 13B show optical element 300 after some embodiments of S250. Conductive material 360 remains disposed within recesses 322 through 328 and electrically coupled to conductive material 360 deposited on electrical isolator 350. Conductive material 360 disposed within recesses 322 through 328 is also substantially flush with adjacent portions of pedestal 320.

According to some embodiments, S240 and S250 may comprise placing a material (e.g., wax, polymer) on areas of surface 320 other than recesses 322, 324, 326 and 328. The material may comprise a material which resists adhesion to the conductive material. The material may be dip-coated, contact-printed, stamped, rolled, painted, etc. onto surface 320.

Conductive material 360 may be thereafter deposited onto the material and recesses 322, 324, 326 and 328. The material is then removed using a chemical stripping method, for example, thereby removing any conductive material that has adhered to the material.

After formation of apparatus 300 of FIGS. 13A and 13B, a solder mask defining an aperture is deposited over the exposed portion of the conductive material at S260. The solder mask may protect the surface surrounding the conductive material during subsequent soldering of electrical contacts to the exposed conductive portions. The solder mask may be deposited using a stencil and a ceramic spray and/or may be deposited using photolithographic techniques.

Figure 14A:
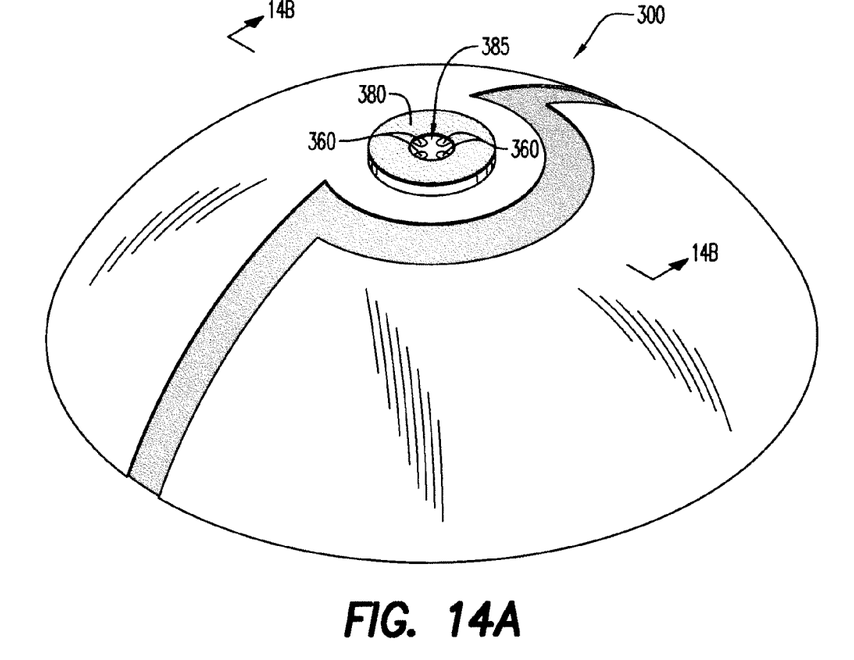
FIG. 14A is a perspective view of a solder mask deposited on an optical element according to some embodiments.
Figure 14B:
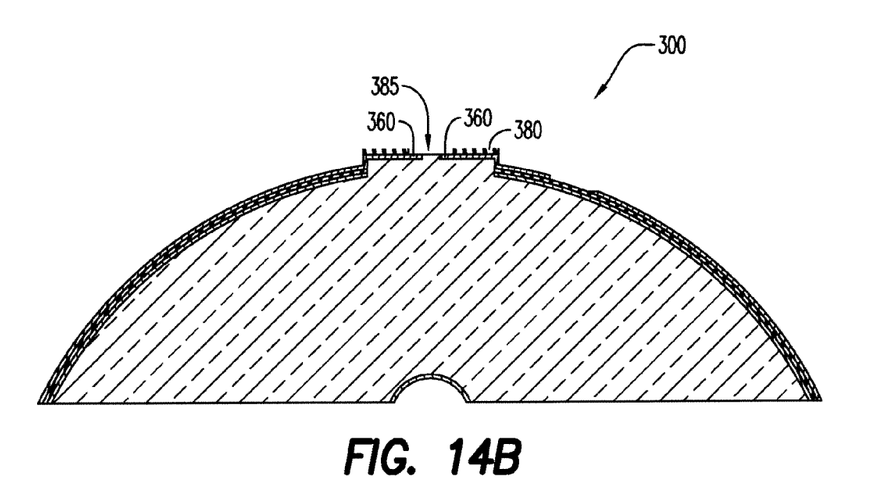
FIG. 14B is a cross-sectional view of a solder mask deposited on an optical element according to some embodiments.

FIGS. 14A and 14B show a perspective view and a cross-sectional view, respectively, of optical element 300 including solder mask 380. Solder mask 380 defines aperture 385 through which portions of conductive material 360 are visible. Solder mask 380 may therefore allow soldering of electrical elements to the visible portions while protecting other portions of conductive material 360.

In this regard, a terminal of a solar cell is coupled to the exposed portion of the conductive material at S270. The terminal may be coupled such that a portion of the solar cell is disposed over the aperture. The portion of the solar cell may comprise an area for receiving photons from which the solar cell generates electrical current.

Figure 15:
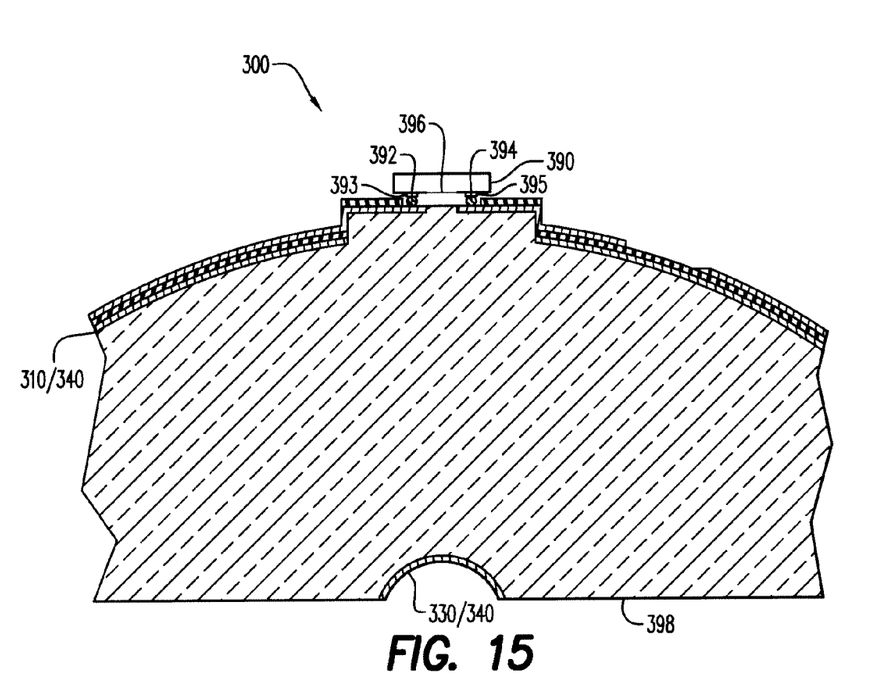
FIG. 15 is a close-up cross-sectional view of an optical element including a solar cell according to some embodiments.

FIG. 15 is a close-up cross-sectional view of element 300 after S270 according to some embodiments. Solar cell 390 may comprise a solar cell (e.g., a III-V cell, II-VI cell, etc.) for receiving photons from optical element 300 and generating electrical charge carriers in response thereto. Solar cell 390 may comprise any number of active, dielectric and metallization layers, and may be fabricated using any suitable methods that are or become known.

Solder bumps 392 and 394 are coupled to conductive material 360 disposed in recesses 322 and 326, respectively. Solder bumps 392 and 394 are also respectively coupled to terminals 393 and 395 of solar cell 390. Various flip-chip bonding techniques may be employed in some embodiments to electrically and physically couple terminals 393 and 395 to the conductive material disposed in recesses 322 and 326. In some embodiments, unshown terminals of solar cell 390 are coupled to conductive material 360 disposed in recesses 324 and 328 of element 300.

According to some embodiments, a protection layer is applied to the exposed portions of conductive material 360 disposed in recesses 322 through 328 prior to S270. The protection layer may comprise a lower layer of nickel and an upper layer of gold. A portion of the gold layer may dissipate during coupling of the terminal at S270.

Some embodiments may avoid deposition of solder mask 380 at S260 by replacing solder bumps 392 and 394 by other interconnects that do not require melting to couple terminals 393 and 395 to conductive material 360 disposed in recesses 322 and 326. Examples of such materials include gold stud bumps and conductive die attaches including silver-filled epoxy. In these embodiments, the coupling may be established by known methods such as ultrasonic welding and other direct chip attachment methods.

According to some embodiments, a thin layer of conductive material is deposited on entire surfaces 310 and 320 of optical element 300. Photoresist is then applied to entire surfaces 310 and 320. The photoresist is patterned and developed such that the photoresist covers all portions of the conductive material except for exposed portions where metal traces are desired. Metal plating is applied which adheres to the exposed portions but not to the photoresist. The photoresist is then removed, and the thin layer of conductive material is removed. The thin layer may be removed by selectively etching in a case that the thin material differs from the metal plating material. In some embodiments, etch time may be controlled to remove the thin layer while leaving a suitable thickness of the metal traces.

Apparatus 300 may generally operate in accordance with the description of aforementioned U.S. Patent Application Publication No. 2006/0231133. With reference to FIG. 15, solar rays enter surface 398 and are reflected by reflective material 340 disposed on convex surface 310. The rays are reflected toward reflective material 340 on concave surface 330, and are thereafter reflected toward aperture 385. The reflected rays pass through aperture 385 and are received by window 396 of solar cell 390. Those skilled in the art of optics will recognize that combinations of one or more other surface shapes may be utilized to concentrate solar rays onto a solar cell.

Solar cell 390 receives a substantial portion of the photon energy received at surface 398 and generates electrical current in response to the received photon energy. The electrical current may be passed to external circuitry (and/or to similar serially-connected apparatuses) through conductive material 360 and conductive material 370. In this regard, solar cell 390 may also comprise a terminal electrically coupled to conductive material 370. Such a terminal would exhibit a polarity opposite to the polarity of terminals 393 and 395.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

The invention claimed is:

1. A method comprising:
creating an optical element comprising essentially of glass having a flat first surface including a concave surface portion, a convex second surface disposed opposite to the flat first surface, and a cylindrical pedestal structure disposed on the concave surface portion, the cylindrical pedestal structure including a flat second surface defining a recess, the flat second surface facing away from the flat first surface;
depositing conductive material on the flat second surface such that a portion of the deposited conductive material is disposed within the recess; and
substantially planarizing the flat second surface to expose the portion of the conductive material disposed within the recess.

2. The method according to claim 1, wherein substantially planarizing the flat second surface comprises chemical-mechanical polishing the conductive material and the flat second surface.

3. A method according to claim 1, wherein creating the optical element comprises molding the optical element with a mold defining the optical element and the recess.

4. A method according to claim 1, wherein depositing the conductive material comprises spraying molten conductive material onto the optical element.

5. A method according to claim 4, wherein depositing the conductive material further comprises placing a stencil on the optical element prior to spraying the molten conductive material onto the optical element.

6. A method according to claim 1, wherein the optical element comprises a transparent portion including the flat second surface.

7. A method according to claim 1, further comprising:
depositing a reflective material on the optical element, the reflective material not being applied to the flat second surface;
depositing an electrical isolator on the reflective material, the electrical isolator not being applied to the flat second surface; and
depositing the conductive material on the electrical isolator.

8. A method according to claim 7, wherein depositing the conductive material on the electrical isolator comprises placing a stencil on the electrical isolator prior to metal spraying the conductive material onto the electrical isolator.

9. A method according to claim 1, further comprising:
depositing a solder mask over the exposed portion of the conductive material,
wherein the solder mask defines an aperture through which light from the optical element may pass.

10. A method according to claim 9, further comprising:
coupling a terminal of a solar cell to the exposed portion of the conductive material,
wherein a portion of the solar cell is disposed over the aperture.

11. A method comprising:
depositing a first material on a solid optical element consisting essentially of glass having a flat first surface including a concave surface portion, a convex second surface disposed opposite to the flat first surface, and a cylindrical pedestal structure disposed on the concave surface portion, the cylindrical pedestal structure including a flat second surface that faces away from the flat first surface and defines at least one elongated radial recess, wherein depositing the first material comprises depositing the first material on the flat second surface of the cylindrical pedestal structure such that none of the first material is disposed in the at least one elongated radial recess;
depositing a conductive material on the first material and within the at least one elongated radial recess; and
removing the first material and any conductive material deposited thereon such that portions of the conductive material remain disposed in the at least one elongated radial recess.

12. A method according to claim 11, wherein depositing the conductive material comprises spraying molten conductive material onto the optical element.

13. A method according to claim 12, wherein depositing the conductive material further comprises placing a stencil on the optical element prior to spraying the molten conductive material onto the optical element.

14. A method according to claim 13, further comprising:
depositing a reflective material on the concave surface portion and the convex second surface of the optical element; and
depositing an electrical isolator on the reflective material, wherein depositing the conductive material further comprises depositing a portion of the conductive material on the electrical isolator.

* * * * *